(12) United States Patent
Hiramoto et al.

(10) Patent No.: US 7,262,430 B2
(45) Date of Patent: Aug. 28, 2007

(54) ORGANIC PHOTOCURRENT MULTIPLICATION DEVICE

(75) Inventors: Masahiro Hiramoto, Takatsuki (JP); Masaaki Yokoyama, Nishinomiya (JP)

(73) Assignee: Japan Science and Technology Corporation, Kawaguchi-shi (JP)

( * ) Notice: Subject to any disclaimer, the term of this patent is extended or adjusted under 35 U.S.C. 154(b) by 286 days.

(21) Appl. No.: 10/380,764

(22) PCT Filed: Mar. 23, 2001

(86) PCT No.: PCT/JP01/02384

§ 371 (c)(1),
(2), (4) Date: Mar. 24, 2003

(87) PCT Pub. No.: WO02/27806

PCT Pub. Date: Apr. 4, 2002

(65) Prior Publication Data

US 2004/0026691 A1 Feb. 12, 2004

(30) Foreign Application Priority Data

Sep. 25, 2000 (JP) .............................. 2000-291079

(51) Int. Cl.
*H01L 35/24* (2006.01)
*H01L 51/00* (2006.01)

(52) U.S. Cl. .......................... 257/40; 257/59; 257/72; 257/E51.003; 257/E21.05; 257/E29.201; 250/307; 250/208.1; 251/21

(58) Field of Classification Search .................. 257/39; 359/108, 318, 107, 101, 112, 261, 242, 247, 359/266, 298

See application file for complete search history.

(56) References Cited

U.S. PATENT DOCUMENTS 5,056,897 A * 10/1991 Akiyama et al. ............. 349/17
5,150,242 A * 9/1992 Fellows ...................... 359/108

(Continued)

FOREIGN PATENT DOCUMENTS

JP 57-64721 4/1982

(Continued)

OTHER PUBLICATIONS

M. Hiramoto et al.; "Light Amplification in a New Light Transducer Combining an Organic Electroluminescent Diode with Photoresponsive Organic Pigment Film"; *Optical Review*; vol. 1, No. 1; 1994; pp. 82-84./Cited in the International Search Report.

(Continued)

*Primary Examiner*—Sue A. Purvis
*Assistant Examiner*—Fazli Erdem
(74) *Attorney, Agent, or Firm*—Edwards Angell Palmer & Dodge LLP

(57) ABSTRACT

Organic semiconductor layers (2, 4) are laminated sandwiching an insulator thin layer (3), and translucent electrodes (1, 5) are formed on the surfaces of the organic semiconductor layers (2, 4), respectively. While a voltage is applied so that the electrode (1) is positive with respect to the electrode (5) and the opposite surfaces of the device are irradiated with two lights (6, 7) simultaneously, photocurrent multiplication is occurred to allow a photocurrent to flow in the device. However, no photocurrent multiplication occurs to allow no flow of photocurrent when the device is irradiated with one of the lights (6, 7).

4 Claims, 8 Drawing Sheets

U.S. PATENT DOCUMENTS

| | | | | |
|---|---|---|---|---|
| 5,182,666 | A | * | 1/1993 | Kawabe ........................ 359/107 |
| 5,543,631 | A | * | 8/1996 | Weinberger ................... 257/40 |
| 5,629,920 | A | * | 5/1997 | Sakano et al. .............. 369/120 |
| 5,903,296 | A | * | 5/1999 | Shimizu et al. ............. 347/139 |
| 6,219,160 | B1 | * | 4/2001 | Nordal et al. ................ 359/107 |
| 6,268,614 | B1 | * | 7/2001 | Imai ............................ 250/591 |
| 6,437,887 | B1 | * | 8/2002 | Usami et al. ................ 359/108 |

FOREIGN PATENT DOCUMENTS

| | | |
|---|---|---|
| JP | 63-292662 | 11/1988 |
| JP | 4-63328 | 2/1992 |
| JP | 5-41283 | 2/1993 |

OTHER PUBLICATIONS

T. Katsume et al.; "High photon conversion in a light transducer combining organic electroluminescent diode with photoresponsive organic pigment film"; *Applied Physics Letters*; vol. 64, No. 19; May 9, 1994; pp. 2546-2548./Cited in the International Search Report.

M. Hiramoto et al.; "Photocurrent multiplication in organic pigment films"; Applied Physics Letter, 64, 187 (1994).

M. Hiramoto et al.; "A light amplification device with organic multilayer thin film structure"; Oyo Buturi, 64, 1036 (1995) with English translation of abstract.

C. W. Tang et al.; "Organic electroluminescent diodes"; Applied Physics Letters, 51, 913 (1987).

Y. Motohashi, et al.; "Photocurrent Multiplication Phenomenon at Organic/Organic Heterojunction and Application to 'NOT' Optical Computing Device"; The Imaging Society of Japan Annual Meeting, Japan Hardcopy '99 Preprint (Tokyo), p. 145-148 (1999), including English abstract.

\* cited by examiner

TPD

OXD

Alq3

ORGANIC PHOTOCURRENT MULTIPLICATION DEVICE

BACKGROUND OF THE INVENTION

1. Field of the Invention

The present invention relates to optoelectronic devices, and more particularly, relates to organic photocurrent multiplication devices using organic semiconductors.

2. Background Art

Conventional photocurrent multiplication devices normally have a structure of a single-layer organic thin film sandwiched by two metal electrodes, in which the device is irradiated with a single light on one side to cause photocurrent multiplication (see M. Hiramoto, T. Imahigashi, M. Yokoyama, Applied Physics Letters, 64, 187 (1994), for example).

There is also known a "light to light" conversion device in which the photocurrent multiplication device described above and an organic electroluminescent device are layered on each other integrally (see M. Hiramoto, T. Katsume, M. Yokoyama, Oyo Buturi, 64, 1036 (1995), for example).

The conventional photocurrent multiplication device including a single-layer organic thin film described above only has a simple function of permitting photocurrent multiplication to occur when the device is irradiated with one light. Therefore, to apply the photocurrent multiplication device to an advanced optical device that controls light by use of two lights, such as an optical operator, a new function must be added. For example, to be provided with an AND function, the photocurrent multiplication device must be configured so that multiplication occurs only by irradiating the device with two lights simultaneously. It is, however, impossible for the conventional photocurrent multiplication device to be provided with such a function.

In view of the above, an object of the present invention is to provide an organic photocurrent multiplication device having an AND function of permitting photocurrent multiplication to occur only when the device is irradiated with two lights.

SUMMARY OF THE INVENTION

The photocurrent multiplication device having an AND function of the present invention comprises three-layer structure of two organic semiconductor layers sandwiching a very thin insulator layer. Generation of an electric field is concentrated on the insulator thin layer with irradiation with two lights, to cause electron tunneling through the insulator and thus brings about multiplication of a photocurrent.

Specifically, the organic photocurrent multiplication device of the present invention has a device structure of depositing organic semiconductor layers on the both sides of an insulator thin layer to apply a voltage to both of the organic semiconductor layers via electrodes. The device realizes an AND operation function by taking two states as follows depending on how to irradiate the organic semiconductor layers with light while the voltage is applied to the device via the electrodes.

(State 1) taken when opposite portions of the organic semiconductor layers are irradiated with lights simultaneously, in which electrons and holes in the organic semiconductor layers excited by the lights are respectively accumulated on opposite surfaces of the insulator thin layer depending on the voltage polarity, to allow a tunnel current to flow through the insulator thin layer due to a concentrated electric field generated in the insulator thin layer.

(State 2) taken when one of the opposite portions of both of the organic semiconductor layers is irradiated with a light or when neither of the opposite portions of the organic semiconductor layers is irradiated with a light, in which tunnel current flowing in the state 1 does not flow.

The photocurrent multiplication device having an AND function as described above can be applied to AND optical operation devices and AND optical operation systems.

The tunnel current flowing in the state 1 can be detected with an ammeter.

Alternatively, an organic electroluminescent (EL) layer may be laminated between the surface of one of the organic semiconductor layers and the electrode, to detect any flow of tunnel current in the state 1 by electroluminescence of the organic electroluminescent layer.

The material used for the insulator thin layer in the present invention may be of any type irrespective of organic or inorganic materials. Examples of organic insulators include TPD (4,4'-bis[N-m-tolyl-N-phenylamino]biphenyl N,N'-di-m-tolyl-N,N' diphenylbenzidine) and OXD and the like represented by the chemical formulae shown in FIG. 3. Examples of inorganic insulators include silicon oxide ($SiO_2$), aluminum oxide ($Al_2O_3$) and the like. These organic or inorganic insulators can be used as an evaporated film.

The photocurrent multiplication according to the present invention is brought about by tunneling of carriers through the insulator thin layer, and therefore, the insulator thin layer is necessary to be a super thin film having a thickness of 30 to 60 nm. If the thickness is less than this range, it is difficult to maintain the insulation while if it is larger than this range, no tunneling occurs.

As the organic semiconductor used for the organic semiconductor layers in the present invention, any type may be used as long as it is a photoconductive organic semiconductor (an organic semiconductor capable of generating carriers by light irradiation). Organic semiconductors are classified into those exhibiting the p-type conductivity (p-type organic semiconductors) and those exhibiting the n-type conductivity (n-type organic semiconductors). Main organic semiconductors used in the present invention are shown in FIG. 2.

Examples of the n-type organic semiconductors include: perylene pigments and derivatives thereof (many types of derivatives different in the substituent attached to a nitrogen atom are known, such as MePTC, t-BuPh-PTC and PhEt-PTC, including Im-PTC having high photoelectric conversion capability); naphthalene derivatives (in which the perylene skeleton of a perylene pigment is substituted with naphthalene, such as NTCDA); and C60 (also called fullerene).

Examples of the p-type organic semiconductors include: phthalocyanine pigments and derivatives thereof (MPc having various metals in the center, $H_2Pc$ having no metal, and ones having various substituents on the periphery); and quinacridon pigments (DQ), porphyrin, merocyanine and the like and derivatives thereof.

The organic semiconductor layers can be formed as evaporated films. The organic semiconductor layers are suitably formed in thickness of 400 to 1000 nm. If the thickness is smaller than this range, a dark current will be great in the resultant device. In addition, with such a small thickness, light exciting one of the semiconductor layers will enter the other semiconductor layer, and therefore, it becomes difficult to control the device with two lights. On the contrary, if the thickness is larger than the range, the device driving voltage will become significantly great, and also the multiplication rate in the photocurrent multiplication phenomenon will become small.

The two organic semiconductors provided on the both sides of the insulator thin layer may be made of a same type of material or different types of materials.

When the two organic semiconductors are made of a same type of material, the respective surfaces of the organic semiconductor layers are irradiated with the two lights.

When the two organic semiconductors are made of a combination of two different types of semiconductors having different absorption range, it is possible to control the device using two lights having different wavelengths. In this case, the two lights can be incident on the same surface of the device. In order to control the device selectively with two monochromatic lights of a long wavelength and a short wavelength, it is preferable to irradiate the surface of one of the organic semiconductor layers having a shorter wavelength absorption range with the two lights.

Particularly, a material having an absorption wavelength range including a long wavelength often absorbs even in a short wavelength side. Therefore, if such a material is irradiated with the two lights having a long wavelength and a short wavelength from such material side, both the long-wavelength and short wavelength lights are absorbed by the material on the irradiation side. As a result, it is not possible to selectively excite only the material absorbing short wavelength light, which is located on the side opposite to the irradiation side, by irradiation with short wavelength light. It is only possible to excite both of the semiconductors simultaneously, or excite only the material on the irradiation side. On the contrary, a material having a short wavelength absorption range does not absorb in a long-wavelength side, providing a window. Therefore, by irradiating the material having a short absorption wavelength range with the two lights, short wavelength light is selectively absorbed by the material on the irradiation side, while long wavelength light passes through the material on the irradiation side without being absorbed and is selectively absorbed by the material on the opposite side.

In the case that the device structure is further provided with an organic EL layer, the organic EL layer may be made of an evaporated film such as an aluminum-quinolinol complex ($Alq_3$) (the chemical formula is shown in FIG. 3), t-BuPh-PTC. The thickness of the organic EL layer is suitably 50 to 100 nm. The organic EL layer is preferably used in the state laminated with a hole transport layer as illustrated in FIG. 6, not as a single layer film such as $Alq_3$.

As the electrode film provided on the side where optical transparency is required, an ITO (indium tin oxide) transparent electrode or an evaporated film of gold or any other metal can be used.

As described above, by sandwiching the insulator thin layer by organic semiconductor layers, the present invention provides an effect of realizing an AND function of permitting photocurrent multiplication to occur only when the device is irradiated with two lights.

BEST MODE FOR CARRYING OUT THE INVENTION

Embodiments of the present invention shall be described with reference to the relevant drawings.

FIRST EMBODIMENT

Figure 1:
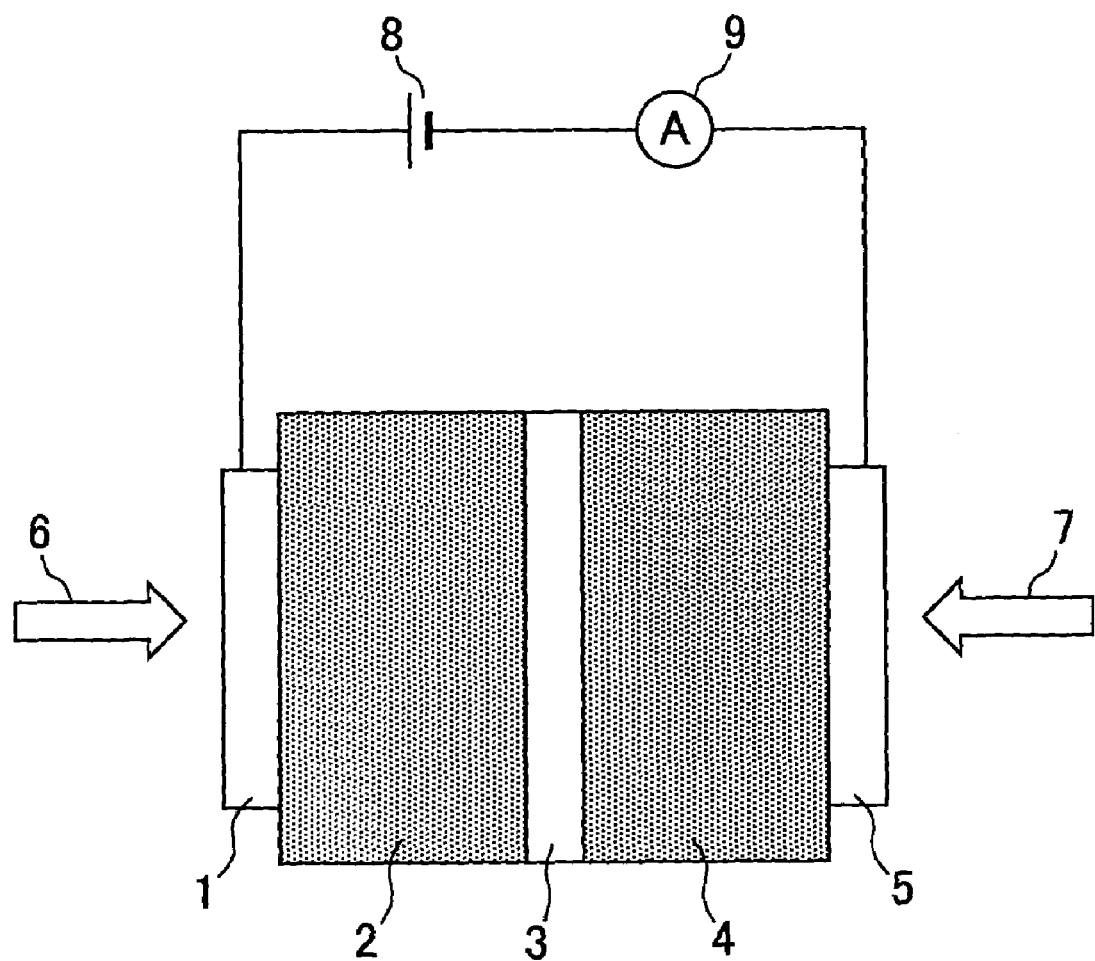
FIG. 1 is a cross-sectional view of the First Embodiment of the organic photocurrent multiplication device having an AND function.
Figure 2:
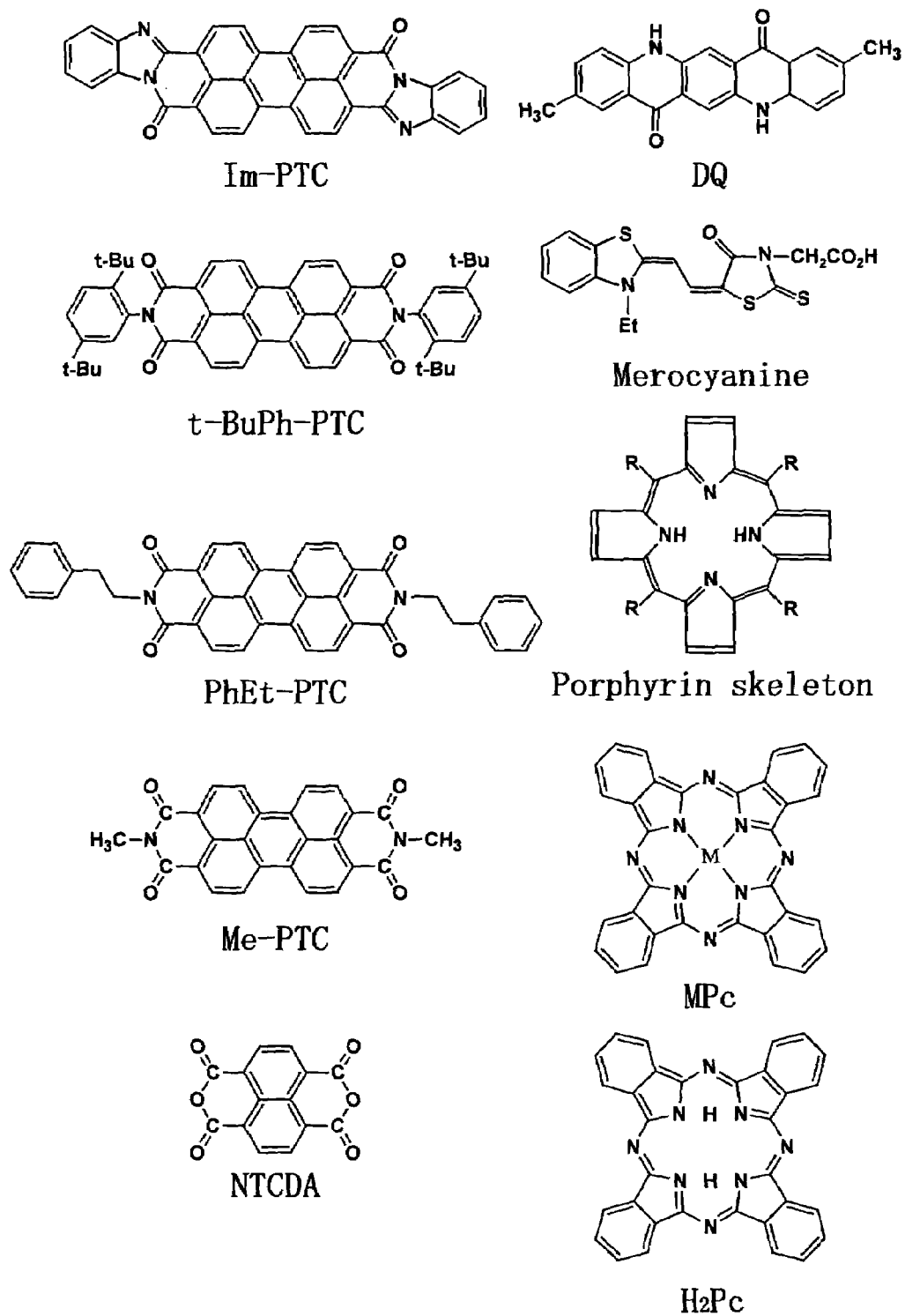
FIG. 2 shows chemical formulae of main organic semiconductors used in the present invention.
Figure 3:
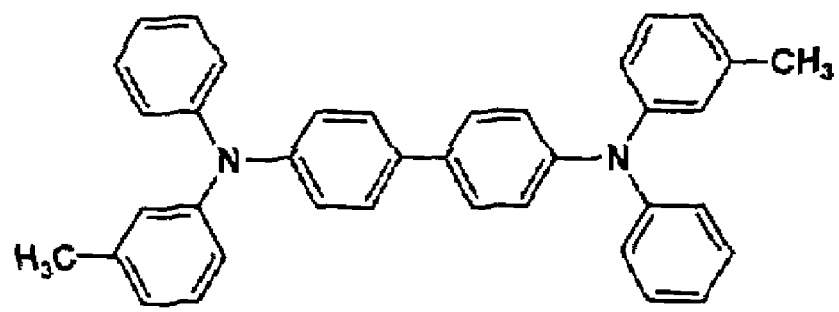
FIG. 3 shows chemical formulae of main organic insulators and organic EL used in the present invention.
Figure 3:
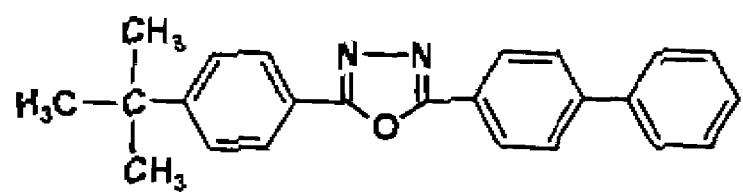
Figure 3:
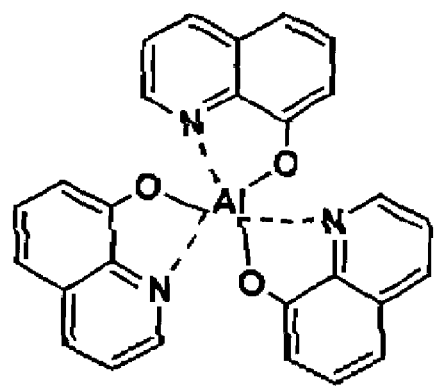

FIG. 1 is a cross-sectional view of the first embodiment. The reference numeral 3 denotes an insulator thin layer, and organic semiconductor layers 2 and 4 are laminated on the both sides thereof sandwiching the insulator thin layer 3. A translucent electrode 1 is formed on the surface of the organic semiconductor layer 2, and a translucent electrode 5 is formed on the surface of the organic semiconductor layer 5. Both electrodes 1 and 5 enable to apply a voltage to the device from a power supply 8. The reference numeral 9 denotes an ammeter for measuring the current flowing to the device.

A TPD evaporated film having a thickness of 50 nm was used as the insulator thin layer 3. A Me-PTC evaporated film having a thickness of 500 nm was used as the organic semiconductor layers 2 and 4. An ITO electrode having a thickness of 60 nm formed on a glass substrate was used as the electrode 1, and a gold translucent evaporated film having a thickness of 20 nm was used as the electrode 5.

The reference numerals 6 and 7 denote irradiation lights, where the irradiation light 6 is irradiated one of the organic semiconductor layers 2 through the translucent electrode 1, and the irradiation light 7 is irradiated the other organic semiconductor layer 4 through the translucent electrode 5.

For the device with the above configuration, when a voltage is applied so that the electrode 1 is positive with respect to the electrode 5, and also the both sides of the device are irradiated with the two lights 6 and 7 simultaneously, photocurrent multiplication occurs allowing a photocurrent to flow in the device. However, when the device is irradiated with only one of the lights 6 and 7, no photocurrent multiplication occurs allowing no flow of photocurrent in the device.

The operation principle of the present invention shall be described using this embodiment.

Figure 4:
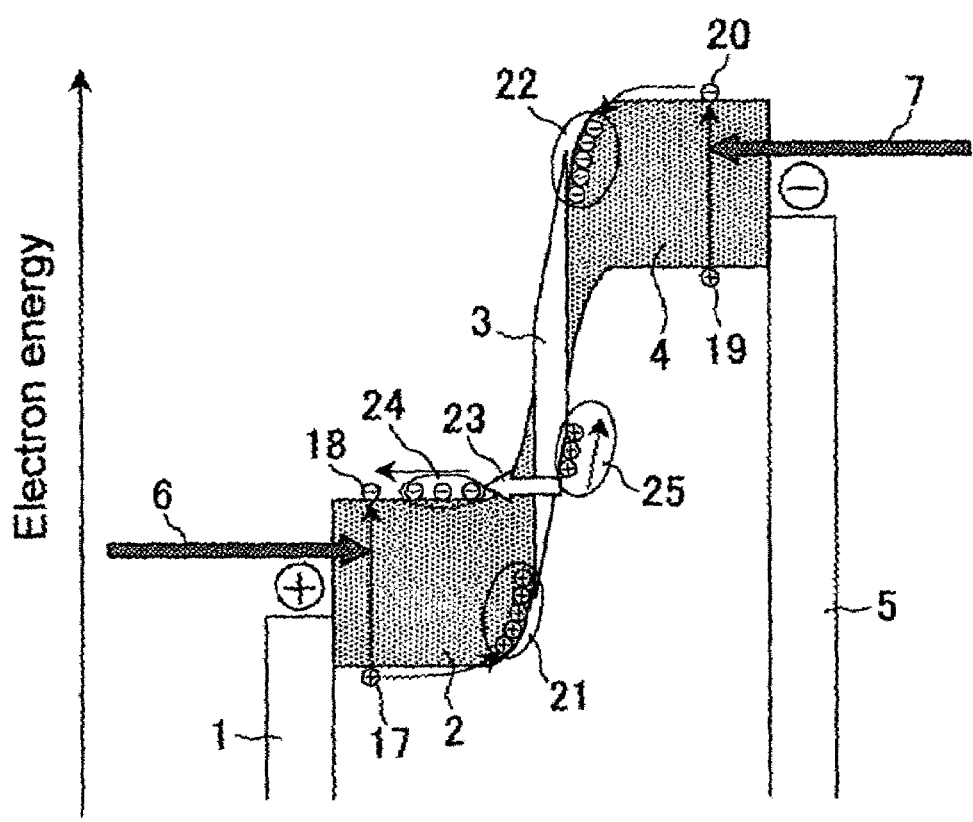
FIG. 4 is an illustration showing an energy structure of the device of the first embodiment during operation.

FIG. 4 illustrates in an embodiment of the FIG. 1, an energy structure during operation of the device, that is, in the state where the both sides of the device are irradiated with the two lights 6 and 7 permitting photocurrent multiplication to occur.

The electrode 1 is positively biased and the electrode 5 is negatively biased. The first light 6 is incident on the organic semiconductor layer 2, and the second light 7 is incident on the organic semiconductor layer 4. The reference numerals 17 and 18 denote a hole and an electron, respectively, photoproduced by the first incident light 6, and 19 and 20 denote a hole and an electron, respectively, photoproduced by the second incident light 7. The reference numeral 21 denotes holes accumulated at the interface of the organic semiconductor 2/insulator thin layer 3, 22 denotes electrons accumulated at the interface of the insulator thin layer 3/organic semiconductor layer 4. The reference numeral 23 denotes tunneling electron injection from the valence band to the conduction band, 24 denotes electrons injected by this tunneling, and 25 denotes holes generated by the tunneling.

As described above, when a voltage is applied to the device and also the device is irradiated with the first and second lights 6 and 7 simultaneously, electron-hole pairs (17, 18 and 19, 20) are photoproduced. Holes are accumulated at the interface between the insulator thin layer 3 and the organic semiconductor layer 2, and electrons are accumulated at the interface between the insulator thin layer 3 and the organic semiconductor layer 4. As a result, a high electric field is applied to the insulator thin layer 3 in a concentrated manner, to finally trigger tunneling 23 of electrons from the valence band to the conduction band. That is, a massive amount of electrons 24 are injected into the organic semiconductor layer 2, while a massive amount of holes 25 are injected into the organic semiconductor layer 4. That is, the photoproduced carriers merely play a role of being accumulated at the organic semiconductor/insulator interfaces. The current flowing through the device is generated by the secondary tunnel electron injection triggered by the concentration of the electric field (multiplied photocurrent). Therefore, the multiplied photocurrent greater than the amount of incident photons flows through the device, causing amplification of the photocurrent (photocurrent multiplication).

To activate the multiplication process described above, both electrons and holes must be accumulated. Therefore, as the lights 6 and 7, selected are lights having wavelengths that can be absorbed intensively by the organic semiconductor layers 2 and 4, respectively, to selectively excite only the corresponding organic semiconductor layers 2 and 4, and in this case, simultaneous irradiation with the two lights 6 and 7 is necessary. Irradiation with only one of the lights 6 and 7 causes accumulation of only one type of carriers, electrons or holes. This fails to provide sufficient concentration of an electric field on the insulator thin layer 3, and thus no multiplied photocurrent flows. In other words, the device has an AND function of permitting a photocurrent to flow only when the two lights 6 and 7 are incident simultaneously.

Figure 5:
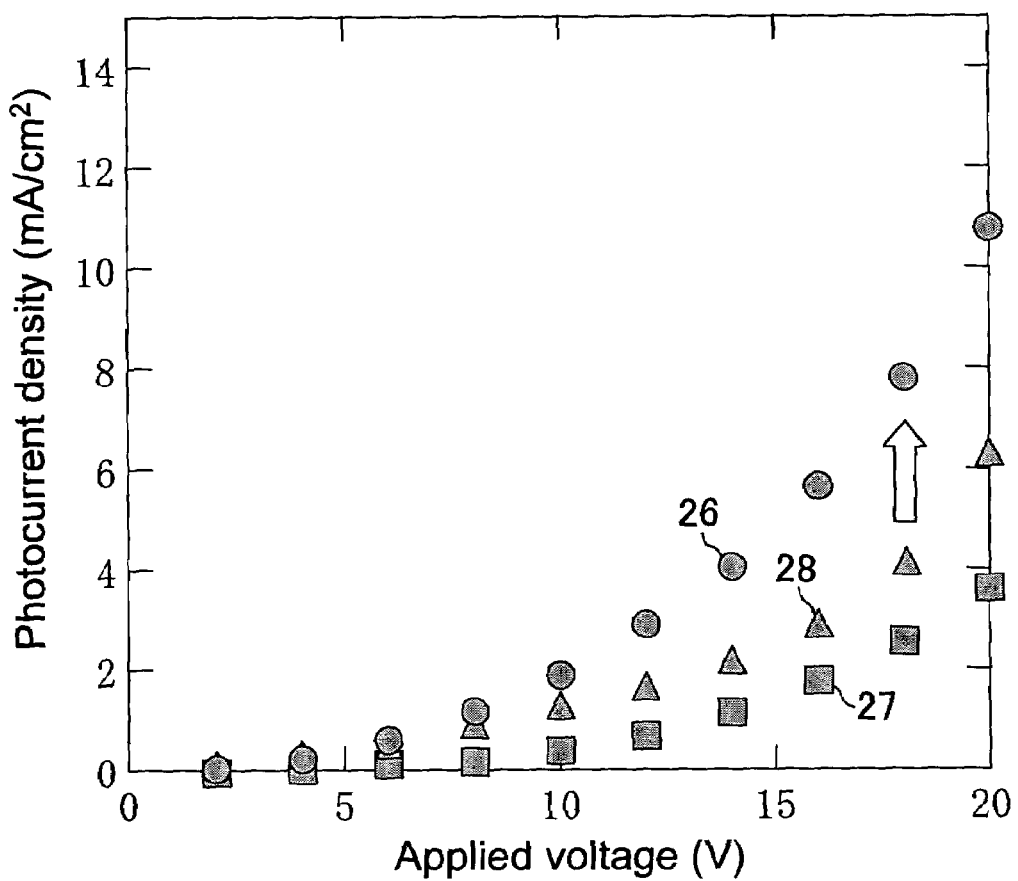
FIG. 5 is a graph showing specific measurement data in the first embodiment.

FIG. 5 shows specific data obtained when Me-PTC was used as the organic semiconductor layers 2 and 4 and TPD was used as the insulator thin layer 3. The x-axis represents the voltage applied to the device, and the y-axis represents the density of multiplied photocurrent flowing through the device. The reference numeral 26 denotes the results obtained by simultaneous irradiation with the first and second lights, 27 denotes the results obtained by irradiation with only the first light, and 28 denotes the results obtained by irradiation with only the second light. For precise evaluation, the total light intensity in the simultaneous irradiation with the two lights denoted by 26 is adjusted to be the same as the light intensity in the one-side irradiation denoted by 27 and 28. The photocurrent in the one-side irradiation is not completely zero, and this implies incompleteness as a device. However, the simultaneous irradiation 26 with two lights brings about a multiplied photocurrent greater than that by the one-side irradiation 27 or 28 with one light. The results, therefore, demonstrate that the AND function according to the principle described above can be provided. The multiplication rate (photocurrent quantum efficiency indicating how many electrons flow through the device by one input photon) of the device was about 9000 at room temperature

EMBODIMENT 2

Figure 6:
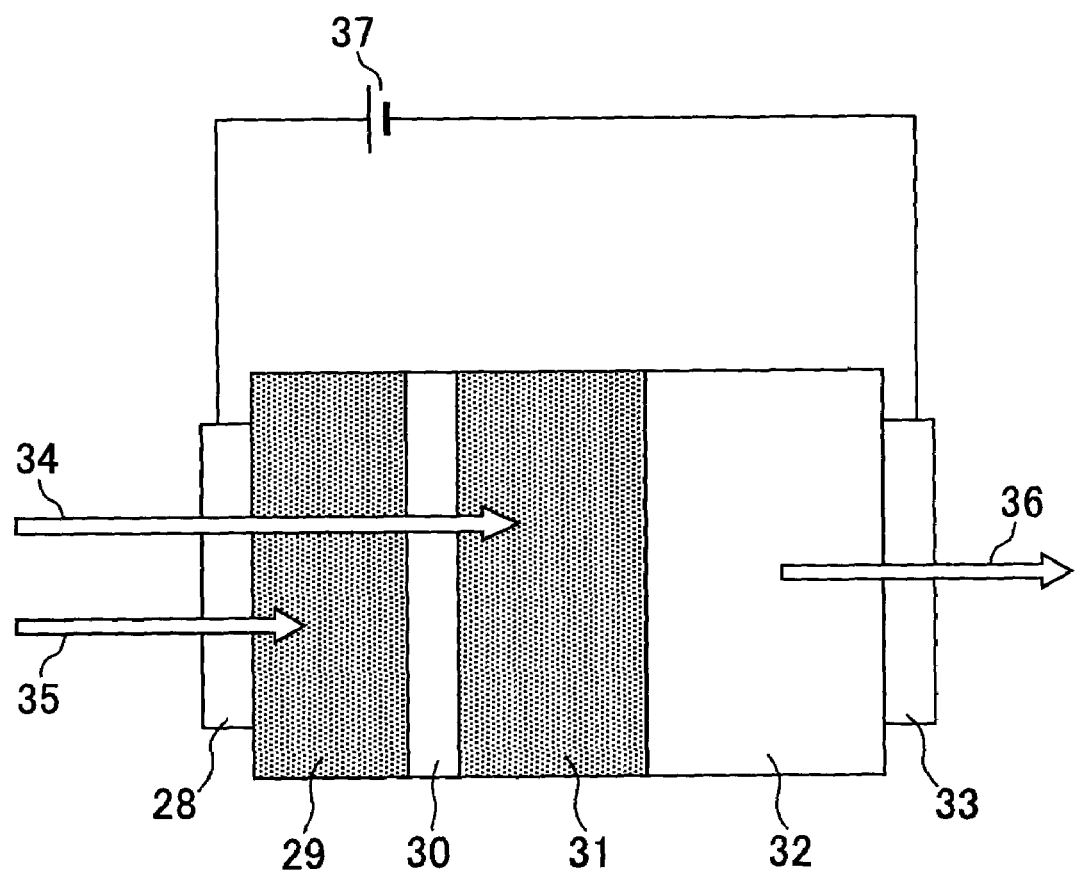
FIG. 6 is a cross-sectional view showing the Second Embodiment additionally provided with an organic EL layer.

FIG. 6 is a cross-sectional view of the Second Embodiment of the present invention.

The reference numeral 30 denotes an insulator thin layer, and organic semiconductor layers 29 and 31 are laminated on the both sides of the insulator thin layer 30 sandwiching the insulator thin layer 30. An organic EL thin film 32 is formed on the surface of the organic semiconductor layer 31. A translucent electrode 28 is formed on the surface of the organic semiconductor layer 29, and a translucent electrode 33 is formed on the surface of the organic EL thin film 32. A voltage can be applied to the device from a power supply 37 via both electrodes 28 and 33.

A TPD evaporated film having a thickness of 50 nm was used as the insulator thin layer 30. A Me-PTC evaporated film having a thickness of 500 nm was used as the organic semiconductor layer 29. A $H_2Pc$ evaporated film having a thickness of 500 nm was used as the organic semiconductor layer 31. A TPD/Alq3 (thickness: 50 nm/50 nm) evaporated layered film (with TPD on the side of the organic semiconductor layer 31) was used as the organic EL layer 32. An Au evaporated film having a thickness of 20 nm was used as the translucent electrodes 28 and 33.

In this embodiment, Me-PTC and $H_2Pc$ were used as a combination of the organic semiconductor layers 29 and 31 for enabling selective exciting of the organic semiconductor layers 29 and 31 by irradiating one side of the device with two types of lights having different wavelengths. Me-PTC has absorption in a wavelength range of 400 to 600 nm, while $H_2Pc$ has absorption in a wavelength range longer than 550 nm. Therefore, by irradiating the Me-PTC side with red and blue lights, separate exciting is attained.

The reference numeral 34 denotes a shorter-wavelength irradiation light absorbed by Me-PTC but not absorbed by $H_2Pc$, 35 denotes a longer-wavelength irradiation light absorbed by $H_2Pc$ but not absorbed by Me-PTC. Both of these lights illuminate the organic semiconductor layers 29 and 31 through the translucent electrode 28. The reference numeral 36 denotes output light from the device.

The device of this embodiment corresponds to a structure of the device of First Embodiment to which an organic EL device is integrally attached. The organic EL device is a device generating electroluminescence (EL) by injecting electrons and holes into a luminescent organic thin film to bring about recombination of them therein. This device has already been reported (see C. W. Tamg, S. A. VanSlyke, Applied Physics Letters, 51, 913 (1987), for example).

With the above configuration, when a voltage is applied so that the electrode 33 is negative with respect to the electrode 28 and also the device is irradiated with the first and second lights 34 and 35 simultaneously, the EL output light 36 emerges from the organic EL layer 32.

Figure 7:
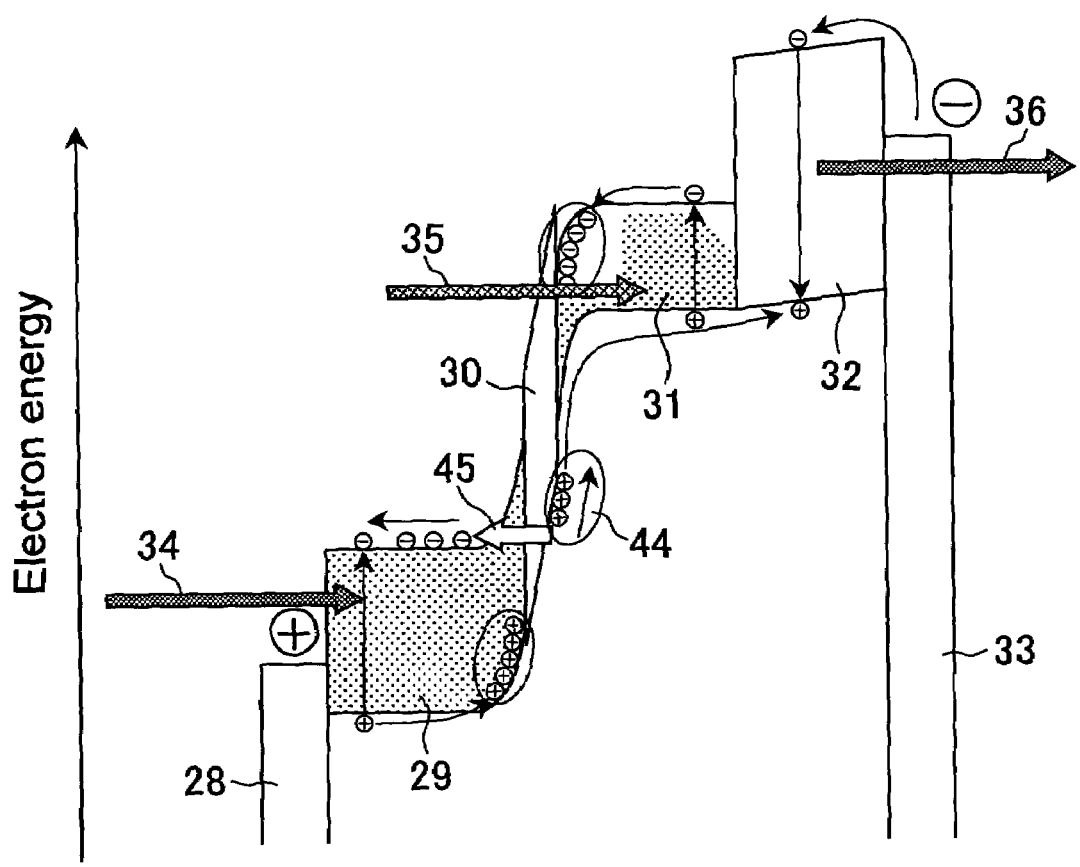
FIG. 7 is an illustration showing an energy structure of the device of the Second Embodiment during operation.

FIG. 7 illustrates an energy structure during operation of the device of this embodiment. The electrode 28 is positively biased and the electrode 33 is negatively biased. The first incident light 34 is absorbed by the organic semiconductor layer 29, while the second incident light 35 passes through the organic semiconductor layer 29 and is absorbed by the organic semiconductor layer 31.

When the device is irradiated with the two incident lights 34 and 35 simultaneously, photocurrent multiplication occurs according to the principle discussed in First Embodiment. The reference numeral 45 denotes tunneling electron injection from the valence band to the conduction band, and 44 denotes holes generated by the tunneling. A large amount of such generated holes are injected into the organic semiconductor layer 31 and then into the organic EL layer 32. On the other hand, electrons are injected into the organic EL layer 32 from the negatively biased electrode 33. In the organic EL layer 32, therefore, the holes and the electrons are recombined together, allowing the EL output light 36 to emerge from the device.

As is apparent from the principle discussed in First Embodiment, to allow the output light 36 to emerge from the device, the device must be irradiated with the two incident lights 34 and 35. No output light emerges from the device only with input of one light.

The resistance of an organic semiconductor is very large in the dark, almost as large as that of an insulator. Therefore, a photocurrent flows only in the direction of the thickness of the device. This indicates that the output light 36 emerges only from the portion of the device in which photocurrent multiplication has occurred. Thus, the device of this embodiment essentially has a capability of handling two-dimensional light images.

Figure 8:
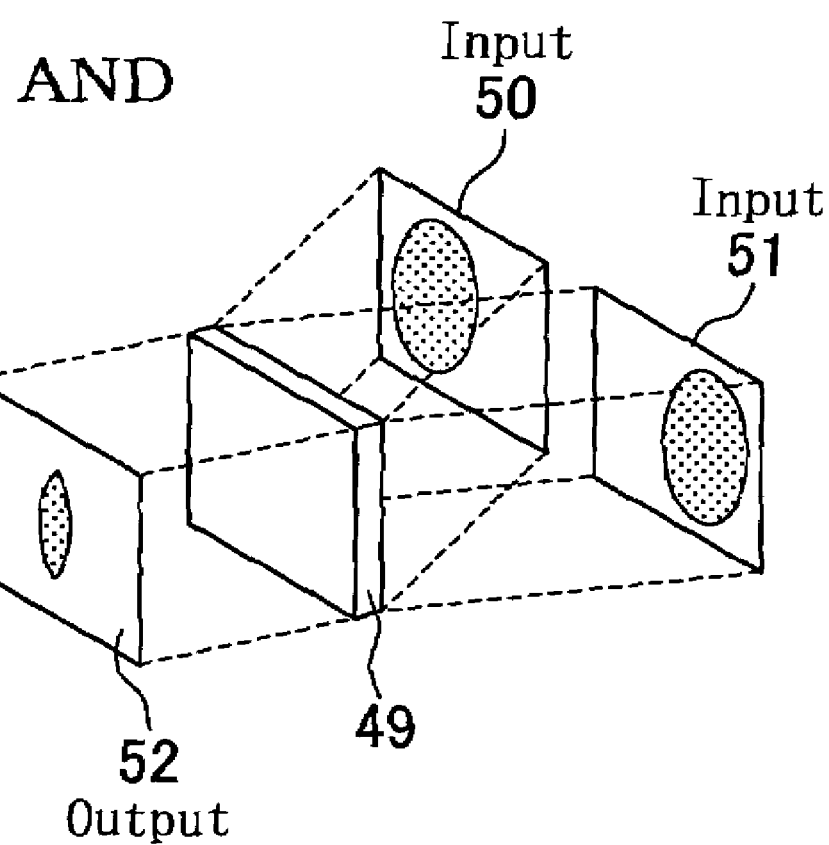
FIG. 8 is a schematic perspective illustration of logical optical operation AND realized by the device of the present invention.

FIG. 8 schematically illustrates the above capability. When a first input light pattern 50 and a second input light pattern 51 are input into the device of Second Embodiment denoted by 49, only an overlap pattern 52 of the two input light patterns is output. This corresponds to AND optical operation as one of principal optical logical operations.

In Second Embodiment, two lights are incident on the same side of the device. Therefore, the two organic semiconductor layers 29 and 31 are desirably made of different types of organic semiconductor materials having different absorptions.

As another configuration of the device, voltages of the opposite polarities may be applied to inject electrons generated by multiplication into the organic EL layer 32.

INDUSTRIAL APPLICABILITY

The organic photocurrent multiplication device of the present invention, provided with an AND function, can be used for AND optical operation devices and AND optical operation systems.

So far, a "light to light" conversion device has been reported in which a photocurrent multiplication device and an organic electroluminescent (EL) device are layered integrally (see M. Hiramoto, T. Katsume, M. Yokoyama, Oyo Buturi, 64, 1036 (1995), for example). This device realizes OR optical operation (when two lights are incident, light emerges from the entire portion of the device irradiated with the lights). Also reported is a NOT optical operation device in which output light can be deleted only for the portion irradiated with light (see the Imaging Society of Japan Annual Meeting, Japan Hardcopy '99 Preprint (Tokyo), p. 145 (1999), for example). In addition, the device of the present invention can execute AND optical operation in which light emerges only from a portion irradiated with two lights simultaneously.

The above indicates that all of the NOT, OR and AND principal logical optical operations are now available. It is therefore possible to attain an optical logical operation device capable of executing optical logical operations of any combinations of the NOT, OR and AND principal logical optical operations, and this provides a possibility of expansion to a final parallel optical operation system.

The invention claimed is:

1. An organic photocurrent multiplication device having an AND operation function, comprising a device structure having two organic semiconductor layers, one deposited on each of both sides of an insulator thin layer to apply a voltage to both of the organic semiconductor layers via electrodes, wherein a thickness of the insulator thin layer is set to allow tunneling of carriers through the insulator thin layer, and the voltage is so set that the device takes one of two states as follows depending on how the organic semiconductor layers are irradiated with light while the voltage is applied to the device via said electrodes:

when said two organic semiconductor layers are irradiated with lights simultaneously, state 1 is taken, in which electrons and holes in said organic semiconductor layers excited by the lights are respectively accumulated on opposite surfaces of said insulator thin layer depending on the voltage polarity, allowing a multiplied tunnel current to flow through the insulator thin layer due to a concentrated electric field generated in the insulator thin layer, and when only one of said two organic semiconductor layers is irradiated with a light or when neither of said organic semiconductor layers is irradiated with a light, state 2 is taken, in which said tunnel current does not flow.

2. The organic photocurrent multiplication device according to claim 1, wherein when both said organic semiconductor layers are irradiated with light, the respective surfaces of the organic semiconductor layers are irradiated.

3. The organic photocurrent multiplication device according to claim 1, wherein when said two organic semiconductor layers have different absorption wavelength ranges and both said organic semiconductor layers are irradiated with lights, lights having different wavelengths are used as lights irradiating the respective organic semiconductor layers and the surface of one of the organic semiconductor layers having shorter wavelength absorption range is irradiated with the lights.

4. The organic photocurrent multiplication device according to any of claims 1, 2 or 3, wherein an organic electroluminescent layer is laminated between the surface of one of said organic semiconductor layers and the electrode, to detect any flow of tunnel current in said state 1 by electroluminescence of said organic electroluminescent layer.

* * * * *